United States Patent
Ning et al.

(10) Patent No.: US 11,914,417 B2
(45) Date of Patent: Feb. 27, 2024

(54) MEMORY

(71) Applicant: CHANGXIN MEMORY TECHNOLOGIES, INC., Hefei (CN)

(72) Inventors: Shu-Liang Ning, Hefei (CN); Jun He, Hefei (CN); Zhan Ying, Hefei (CN); Jie Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 66 days.

(21) Appl. No.: 17/739,563

(22) Filed: May 9, 2022

(65) Prior Publication Data
US 2023/0126683 A1 Apr. 27, 2023

Related U.S. Application Data

(63) Continuation of application No. PCT/CN2021/125785, filed on Oct. 22, 2021.

(30) Foreign Application Priority Data

Aug. 26, 2020 (CN) .......................... 202010873269.6

(51) Int. Cl.
*G06F 1/00* (2006.01)
*G06F 1/06* (2006.01)
(Continued)

(52) U.S. Cl.
CPC ............ *G06F 1/06* (2013.01); *G11C 11/4076* (2013.01); *G11C 11/4096* (2013.01)

(58) Field of Classification Search
CPC . G06F 1/04; G06F 1/06; G06F 1/3275; G06F 15/161; G11C 11/4076;
(Continued)

(56) References Cited

U.S. PATENT DOCUMENTS

| 5,353,243 | A | 10/1994 | Read |
| 7,133,324 | B2 | 11/2006 | Park |

(Continued)

FOREIGN PATENT DOCUMENTS

| CN | 1502108 A | 6/2004 |
| CN | 1527322 A | 9/2004 |

(Continued)

OTHER PUBLICATIONS

International Search Report and English Translation in the international application No. PCT/CN2021/104776, dated Oct. 13, 2021, 6 pages.

(Continued)

*Primary Examiner* — Nitin C Patel
(74) *Attorney, Agent, or Firm* — Cooper Legal Group, LLC

(57) ABSTRACT

A memory is provided. The memory includes: a control chip; and a plurality of storage chips, in which the plurality of storage chips are electrically connected with the control chip via a common communication channel, the plurality of storage chips are configured to perform information interaction with the control chip by adopting different clock edges of a first clock signal, the first clock signal has a first clock cycle, the different clock edges include two consecutive rising edges and/or two consecutive falling edges, the plurality of storage chips are further configured to receive a second clock signal and distinguish the different clock edges based on the second clock signal, and a second clock cycle of the second clock signal is greater than the first clock cycle.

16 Claims, 4 Drawing Sheets

(51) Int. Cl.
  *G11C 11/4076* (2006.01)
  *G11C 11/4096* (2006.01)
(58) Field of Classification Search
  CPC ............ G11C 11/4087; G11C 11/4093; G11C 11/4096; G11C 7/1093; G11C 7/222; G11C 5/025; G11C 5/066; G11C 8/12
  See application file for complete search history.

(56) References Cited

U.S. PATENT DOCUMENTS

| | | | |
|---|---|---|---|
| 7,555,625 B2 * | 6/2009 | Nam | G06F 13/4234 711/150 |
| 8,194,090 B2 | 6/2012 | Sato | |
| 8,447,908 B2 | 5/2013 | Bruce | |
| 8,635,390 B2 | 1/2014 | Hnatko | |
| 8,947,931 B1 | 2/2015 | D'Abreu | |
| 9,170,744 B1 | 10/2015 | Smith | |
| 9,396,766 B2 | 7/2016 | Lym | |
| 9,805,802 B2 | 10/2017 | Son et al. | |
| 10,283,178 B2 | 5/2019 | Takahashi | |
| 10,446,198 B2 | 10/2019 | Hasbun et al. | |
| 10,593,383 B1 | 3/2020 | Kim | |
| 10,725,913 B2 | 7/2020 | Hasbun et al. | |
| 10,762,012 B2 | 9/2020 | Lee | |
| 10,908,827 B2 | 2/2021 | Choi et al. | |
| 10,915,473 B2 | 2/2021 | Jang | |
| 10,978,116 B2 | 4/2021 | Hasbun et al. | |
| 10,997,065 B2 | 5/2021 | Ha et al. | |
| 11,037,608 B2 | 6/2021 | Park et al. | |
| 2002/0018393 A1 | 2/2002 | Kyung | |
| 2002/0060948 A1 | 5/2002 | Chang | |
| 2002/0174311 A1 | 11/2002 | Ware | |
| 2003/0086329 A1 | 5/2003 | Ebihara | |
| 2004/0054845 A1 | 3/2004 | Ware | |
| 2004/0105292 A1 | 6/2004 | Matsui | |
| 2004/0170072 A1 | 9/2004 | Ware | |
| 2005/0169097 A1 | 8/2005 | Ware | |
| 2006/0007761 A1 | 1/2006 | Ware | |
| 2006/0039174 A1 | 2/2006 | Ware | |
| 2006/0069895 A1 | 3/2006 | Ware | |
| 2006/0090149 A1 | 4/2006 | Blanco | |
| 2006/0129776 A1 | 6/2006 | Ware | |
| 2006/0233012 A1 | 10/2006 | Sekiguchi | |
| 2007/0064462 A1 | 3/2007 | Matsui | |
| 2007/0255919 A1 | 11/2007 | Ware | |
| 2009/0063887 A1 | 3/2009 | Ware | |
| 2009/0122587 A1 | 5/2009 | Matsui | |
| 2009/0138646 A1 | 5/2009 | Ware | |
| 2009/0150710 A1 | 6/2009 | Bilger | |
| 2009/0184971 A1 | 7/2009 | Sato | |
| 2010/0091537 A1 | 4/2010 | Best | |
| 2011/0161568 A1 | 6/2011 | Bruce | |
| 2011/0164460 A1 | 7/2011 | Kajigaya | |
| 2012/0059958 A1 | 3/2012 | Hnatko | |
| 2012/0059977 A1 | 3/2012 | Chuang | |
| 2012/0092944 A1 | 4/2012 | Lin | |
| 2012/0182776 A1 | 7/2012 | Best | |
| 2012/0213020 A1 | 8/2012 | Ware | |
| 2012/0287725 A1 | 11/2012 | Ware | |
| 2012/0294058 A1 | 11/2012 | Best | |
| 2013/0148448 A1 | 6/2013 | Matsui | |
| 2013/0227229 A1 | 8/2013 | Ishikawa | |
| 2013/0250706 A1 | 9/2013 | Ware et al. | |
| 2013/0279278 A1 | 10/2013 | Ware et al. | |
| 2013/0305079 A1 | 11/2013 | Ware et al. | |
| 2014/0098622 A1 | 4/2014 | Ware et al. | |
| 2014/0169111 A1 | 6/2014 | Kajigaya et al. | |
| 2014/0247637 A1 | 9/2014 | Best | |
| 2014/0293705 A1 | 10/2014 | Gillingham | |
| 2015/0043290 A1 | 2/2015 | Ware et al. | |
| 2015/0187410 A1 | 7/2015 | Nelson | |
| 2015/0332753 A1 | 11/2015 | Best et al. | |
| 2016/0065190 A1 | 3/2016 | Paul | |
| 2016/0093378 A1 | 3/2016 | Lym | |
| 2016/0196864 A1 | 7/2016 | Ware et al. | |
| 2016/0225431 A1 | 8/2016 | Best et al. | |
| 2017/0053691 A1 | 2/2017 | Ware et al. | |
| 2017/0069364 A1 | 3/2017 | Shin et al. | |
| 2017/0076768 A1 | 3/2017 | Son et al. | |
| 2017/0194945 A1 | 7/2017 | Paul | |
| 2017/0365309 A1 | 12/2017 | Shin et al. | |
| 2018/0005689 A1 | 1/2018 | Hsieh | |
| 2018/0012644 A1 | 1/2018 | Ware et al. | |
| 2018/0033489 A1 | 2/2018 | Son et al. | |
| 2018/0122434 A1 | 5/2018 | Lee | |
| 2018/0166121 A1 | 6/2018 | Best et al. | |
| 2018/0218762 A1 | 8/2018 | Matsui | |
| 2018/0293190 A1 | 10/2018 | Jang | |
| 2019/0065050 A1 | 2/2019 | Shin et al. | |
| 2019/0102298 A1 | 4/2019 | Hasbun et al. | |
| 2019/0102330 A1 | 4/2019 | Hasbun et al. | |
| 2019/0103143 A1 | 4/2019 | Hasbun et al. | |
| 2019/0146911 A1 | 5/2019 | Ha et al. | |
| 2019/0198084 A1 | 6/2019 | Penney | |
| 2019/0205051 A1 | 7/2019 | Choi et al. | |
| 2019/0221249 A1 | 7/2019 | Best et al. | |
| 2019/0311762 A1 | 10/2019 | Penney | |
| 2019/0325936 A1 | 10/2019 | Ware et al. | |
| 2019/0348085 A1 | 11/2019 | Matsui | |
| 2020/0020367 A1 | 1/2020 | Hasbun et al. | |
| 2020/0075069 A1 | 3/2020 | Kim | |
| 2020/0125257 A1 | 4/2020 | Shin et al. | |
| 2020/0125506 A1 | 4/2020 | Crisp | |
| 2020/0176038 A1 | 6/2020 | Kim | |
| 2020/0202910 A1 | 6/2020 | Park et al. | |
| 2020/0278790 A1 | 9/2020 | Shin et al. | |
| 2020/0321047 A1 | 10/2020 | Best et al. | |
| 2020/0327057 A1 | 10/2020 | Hasbun et al. | |
| 2021/0005234 A1 | 1/2021 | Galbi et al. | |
| 2021/0027825 A1 | 1/2021 | Ware et al. | |
| 2021/0193215 A1 | 6/2021 | Best et al. | |
| 2021/0272608 A1 | 9/2021 | Matsui | |
| 2021/0358529 A1 | 11/2021 | Shin et al. | |
| 2022/0139446 A1 | 5/2022 | Best et al. | |
| 2022/0351764 A1 | 11/2022 | Shin et al. | |
| 2023/0018344 A1 | 1/2023 | Matsui | |

FOREIGN PATENT DOCUMENTS

| | | |
|---|---|---|
| CN | 101488337 A | 7/2009 |
| CN | 102402493 A | 4/2012 |
| CN | 102456392 A | 5/2012 |
| CN | 102541782 A | 7/2012 |
| CN | 103150272 A | 6/2013 |
| CN | 106463499 A | 2/2017 |
| CN | 106796813 A | 5/2017 |
| CN | 206400408 U | 8/2017 |
| CN | 109599138 A | 4/2019 |
| CN | 109599139 A | 4/2019 |
| CN | 109599141 A | 4/2019 |
| CN | 109783009 A | 5/2019 |
| CN | 109994138 A | 7/2019 |
| CN | 110880341 A | 3/2020 |
| CN | 111540391 A | 8/2020 |
| CN | 211207252 U | 8/2020 |
| CN | 114115441 A | 3/2022 |

OTHER PUBLICATIONS

International Search Report and English Translation in the international application No. PCT/CN2021/098752, dated Sep. 8, 2021, 6 pages.
International Search Report and English Translation in the international application No. PCT/CN2021/099868, dated Sep. 15, 2021, 5 pages.
International Search Report and English Translation in the international application No. PCT/CN2021/103706, dated Sep. 28, 2021, 6 pages.
International Search Report and English Translation in the international application No. PCT/CN2021/125785, dated Jan. 25, 2022, 7 pages.

(56) References Cited

OTHER PUBLICATIONS

Supplementary European Search Report in the European application No. 21860596.2, dated Nov. 23, 2022, 8 pgs.
Supplementary Partial European Search Report in the European application No. 21859788.8, dated Dec. 1, 2022, 17 pgs.
Supplementary European Search Report in the European application No. 21859788.8, dated Mar. 16, 2023, 16 pages.
First Office Action of the U.S. Appl. No. 17/445,658, dated Mar. 30, 2023, 35 pages.
First Office Action of the Chinese application No. 202010873263.9, dated Jul. 22, 2023, 7 pages with English abstract.
Notice of Allowance of the Chinese application No. 202010873269.6, dated Jun. 29, 2023, 5 pages with English abstract.
English translation of the Written Opinion of the International Search Authority in the international application No. PCT/CN2021/125785, dated Jan. 25, 2022, 4 pages.
English translation of the Written Opinion of the International Search Authority in the international application No. PCT/CN2021/099868, dated Sep. 15, 2021, 4 pages.

\* cited by examiner

MEMORY

CROSS-REFERENCE TO RELATED APPLICATION

This application is a continuation of International Patent Application No. PCT/CN2021/125785, filed on Oct. 22, 2021, which is based on and claims the priority from Chinese patent application No. 202010873269.6, filed on Aug. 26, 2020 and entitled "Memory". The contents of International Patent Application No. PCT/CN2021/125785 and Chinese patent application No. 202010873269.6 are hereby incorporated by reference in their entireties.

BACKGROUND

Dynamic Random Access Memory (DRAM) is a common semiconductor storage device in a computer and is composed of many repeated storage units. Each storage unit usually includes a capacitor and a transistor. Gates of the transistors are connected with a word line, drains of the transistors are connected with a bit line, and sources of the transistors are connected with the capacitors. Voltage signals on the word line can control on or off of the transistors, so that data information stored in the capacitors is read through the bit line, or the data information is written into the capacitors for storage through the bit line.

With more and more application fields of the DRAM, for example, the DRAM is increasingly applied to various fields, a user has higher and higher requirements for a performance index of the DRAM, and has different requirements for the DRAM due to the different application fields.

SUMMARY

Embodiments of the present disclosure relate to, but are not limited to, the technical field of semiconductors, and in particular to a memory.

An embodiment of the present disclosure provides a memory, including: a control chip; and a plurality of storage chips, in which the plurality of storage chips are electrically connected with the control chip via a common communication channel, the plurality of storage chips are configured to perform information interaction with the control chip by adopting different clock edges of a first clock signal, the first clock signal has a first clock cycle, the different clock edges include two consecutive rising edges and/or two consecutive falling edges, the plurality of storage chips are further configured to receive a second clock signal and distinguish the different clock edges based on the second clock signal, and a second clock cycle of the second clock signal is greater than the first clock cycle.

BRIEF DESCRIPTION OF THE DRAWINGS

One or more embodiments are exemplarily illustrated through diagrams in the drawings corresponding thereto, and unless otherwise specifically specified, the graphs in the drawings do not limit the proportion.

DETAILED DESCRIPTION

It can be known from the background that performance of a memory needs to be improved currently.

An embodiment of the present disclosure provides a memory, a plurality of storage chips. The plurality of storage chips share a communication channel to be electrically connected with a control chip. The plurality of storage chips are configured to perform information interaction with the control chip by adopting different clock edges of a first clock signal, the first clock signal has a first clock cycle, and the different clock edges comprises two consecutive rising edges and/or two consecutive falling edges. The plurality of storage chips are further configured to receive a second clock signal and distinguish the different clock edges based on the second clock signal, and a second clock cycle of the second clock signal is greater than the first clock cycle. Since the plurality of storage chips share the communication channel, under the premise of not influencing the quality of information interaction between the plurality of storage chips and the control chip, the number of the communication channel required by the memory is decreased, thereby saving the area of the memory, reducing the cost of the memory, and reducing power consumption of the memory.

In order to make the objective, technical solutions and advantages of the embodiments of the present disclosure more clear, all the embodiments of the present disclosure will be described below in detail with reference to the drawings. However, the ordinary skilled in the art may understand that a lot of technical details are proposed to make the present disclosure better understood by a reader in the embodiments of the present disclosure. However, the technical solution claimed in the present disclosure can also be implemented without these technical details and various changes and modifications based on the following embodiments.

Figure 1:
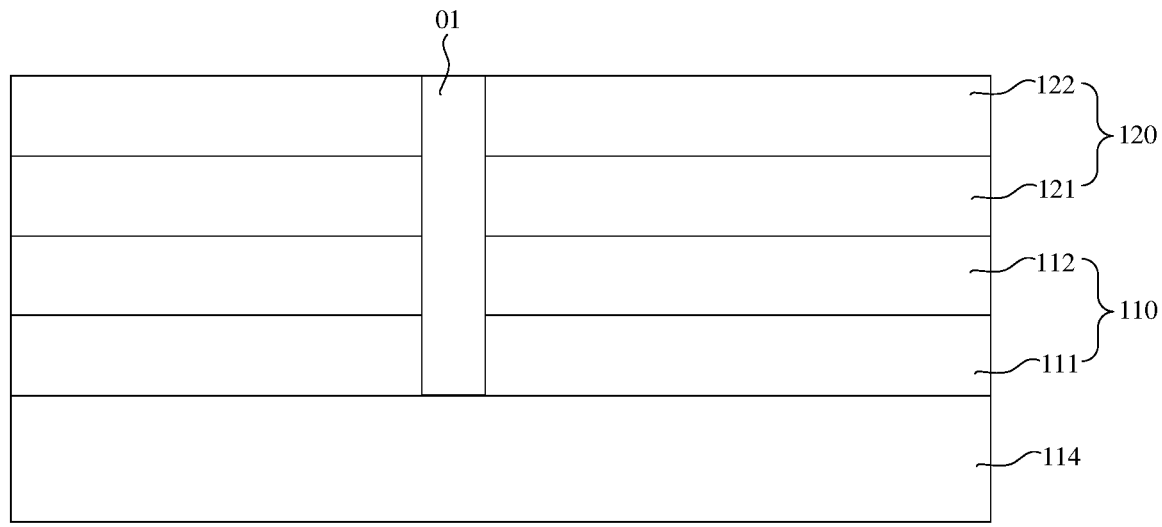
FIG. 1 is a schematic structural diagram of a memory provided by an embodiment of the present disclosure.

FIG. 1 is a schematic structural diagram of a memory provided by an embodiment of the present disclosure.

Referring to FIG. 1, in the embodiment, the memory includes: a control chip 114; and a plurality of storage chips, in which the plurality of storage chips share a communication channel 01 to be electrically connected with the control chip 114. The plurality of storage chips are configured to perform information interaction with the control chip 114 by adopting different clock edges of a first clock signal, the first clock signal has a first clock cycle, and the different clock edges comprises two consecutive rising edges and/or two consecutive falling edges. The plurality of storage chips are further configured to receive a second clock signal and distinguish the different clock edges based on the second clock signal, and a second clock cycle of the second clock signal is greater than the first clock cycle.

The memory provided by the embodiment will be illustrated below in detail with reference to the drawings.

In the embodiment, the memory may be a dynamic random access memory.

Specifically, the plurality of storage chips may be sequentially stacked on the control chip 114, thereby improving a storage density and decreasing a distance between the storage chips and the control chip 114 advantageously. Or, the plurality of storage chips may also be disposed on the control chip 114 side by side, thereby reducing a longitudinal thickness of the memory advantageously. In the embodiment, the plurality of storage chips are sequentially stacked on the control chip 114, and the communication channel 01 includes a Through Silicon Via (TSV).

Specifically, different clock edges include a first rising edge, a first falling edge, a second rising edge and a second falling edge that are consecutive. It could be considered that the first rising edge and the first falling edge are the clock edges within the previous first clock cycle. The second rising edge and the second falling edge are the clock edges within the next first clock cycle. The second clock signal is used as the reference for distinguishing different clock edges, such that different clock edges of the same first clock cycle (first rising edge/first falling edge/second rising edge/second falling edge) can be distinguished from each other. In this way, although plurality of storage chips share the communication channel 01, each storage chip can perform information interaction with the control chip 114 by adopting the corresponding clock edge.

Figure 2:
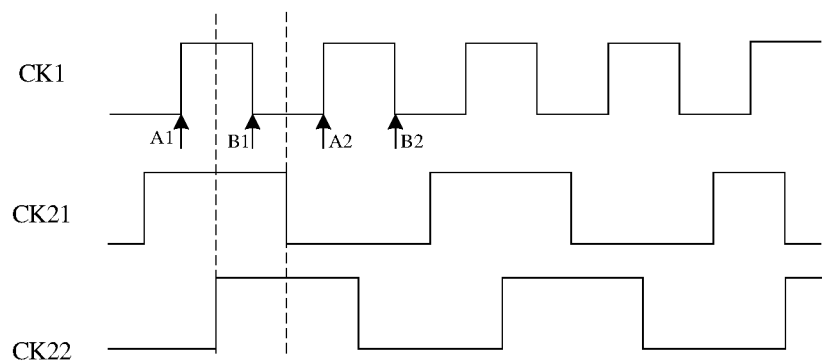
FIG. 2 is two different oscillograms of a first clock signal and second clock signal.

Specifically, as illustrated in FIG. 2, FIG. 2 is waveform diagram of a first clock signal and second clock signal. CK1 represents the first clock signal, and CK21 and CK22 represent two types of second clock signals, respectively. The second clock cycle is greater than the first clock cycle. In this way, the first rising edge A1 and the second rising edge A2 are in different level period of the second clock signal, respectively, such that the first rising edge A1 can be distinguished from the second rising edge A2. Similarly, the first falling edge B1 can be distinguished from the second falling edge B2. In an embodiment, the first rising edge A1 can appear in the period of high level signal of the second clock signal, and the second rising edge A2 appears in the period of low level signal of the second clock signal, or vice versa. The same applies for the first falling edge B1 and the second falling edge B2.

As illustrated in CK1 and CK21 in FIG. 2, the first rising edge A1 and the first falling edge B1 appear in the period of high level signal of CK21, and the second rising edge A2 and the second falling edge B2 appear in the period of low level signal of CK21.

It is to be noted that the position relationship of the first clock signal and the second signal is not limited to the situation illustrated in FIG. 2. Those skilled in the art can set by themselves as long as different clock edges of the first clock signal can be distinguished based on the second clock signal as mentioned above.

In the embodiment, the second clock cycle is equal to 2 times the first clock cycle. That is, the first clock cycle is equal to a half of the second clock cycle. In this way, it is advantageous to further avoid that the first rising edge and the second rising edge appear at the same level signal period of the second clock cycle and that the first falling edge and the second falling edge appear at the same level signal period of the second clock cycle. It is to be noted that the second clock cycle may also be other times the first clock cycle, which is not limited in the embodiment of the present disclosure.

The plurality of storage chips include a first storage chip set 110 and a second storage chip set 120. The storage chips of the first storage chip set 110 are configured to perform information interaction with the control chip 114 by adopting the first rising edge and/or the first falling edge. The storage chips of the second storage chip set 120 are configured to perform information interaction with the control chip 114 by adopting the second rising edge and/or the second falling edge. The information interaction includes reading operation and writing operation.

Detailed description will be made in an example in which the first storage chip set 110 performs information interaction with the control chip 114 by adopting the first rising edge and the first falling edge, and the second storage chip set 120 performs information interaction with the control chip 114 by adopting the second rising edge and the second falling edge. The first storage chip set 110 includes a first storage chip 111 and a second storage chip 112. The second storage chip set 120 includes a third storage chip 121 and a fourth storage chip 122. That is, four storage chips share the channel 01.

In the embodiment, as illustrated in FIG. 1, the first storage chip 111 performs information interaction with the control chip 114 at the first rising edge, and the second storage chip 120 performs information interaction with the control chip 114 at the first falling edge. The second storage chip set 120 includes a third storage chip 121 and a fourth storage chip 122, the third storage chip 121 performs information interaction with the control chip 114 at the second rising edge, and the fourth storage chip 122 performs information interaction with the control chip 114 at the second falling edge.

It is to be noted that the first storage chip 111 and the second storage chip 112 may be located in adjacent layers, or may also be spaced by other storage chips. The third storage chip 121 and the fourth storage chip 122 may be located in adjacent layers, or may also be spaced by other storage chips.

Since the first storage chip 111 and the second storage chip 112 work at different clock states of the same first clock signal, an overall macroscopic operation mode of the first storage chip 111 and the second storage chip 112 is: data are transmitted at both the first rising edge and the first falling edge of the first clock signal. Therefore, the data are transmitted at one of the first rising edge or the first falling edge of the first clock signal as for the single storage chip, but the data may be transmitted at both the first rising edge and the first falling edge of the first clock signal as for the overall memory. Similarly, the third storage chip 121 and the fourth storage chip 122 also work at different clock states of the same first clock signal, and also have the effect that the data are transmitted at both the second rising edge and the second falling edge as for the overall memory.

Furthermore, the first clock signal includes a first command clock and a first data clock. As for the first storage chip set 110, the first storage chip 111 performs information interaction with the control chip 114 at a first rising edge of the first command clock and/or the first data clock; and the second storage chip 112 performs information interaction with the control chip 114 at a first falling edge of the first command clock and/or the first data clock. As for the second storage chip set 120, the third storage chip 121 performs information interaction with the control chip 114 at a second rising edge of the first command clock and/or the first data clock; and the fourth storage chip 122 performs information interaction with the control chip 114 at a second falling edge of the first command clock and/or the first data clock.

Taking the first storage chip 111 as an example, the first storage chip 111 is configured to receive a command signal at the first rising edge of the first command clock. The command signal is configured to control read/write operation of the first storage chip 111, and receive a data signal to be written into the first storage chip 111 or send the data signal at the first rising edge of the corresponding data clock. Relevant description related to the second storage chip 112, the third storage chip 121 and the fourth storage chip 122 may refer to the first storage chip 111.

In the embodiment, in order to reduce complexity of the memory, the first command clock and the first data clock adopt the same first clock signal. In this way, circuit design is simplified advantageously, a data receiving or sending error caused by an error generated by handshake or synchronization of the first command clock and the first data clock is avoided, and a storage accurate rate of the memory is increased.

Figure 3:
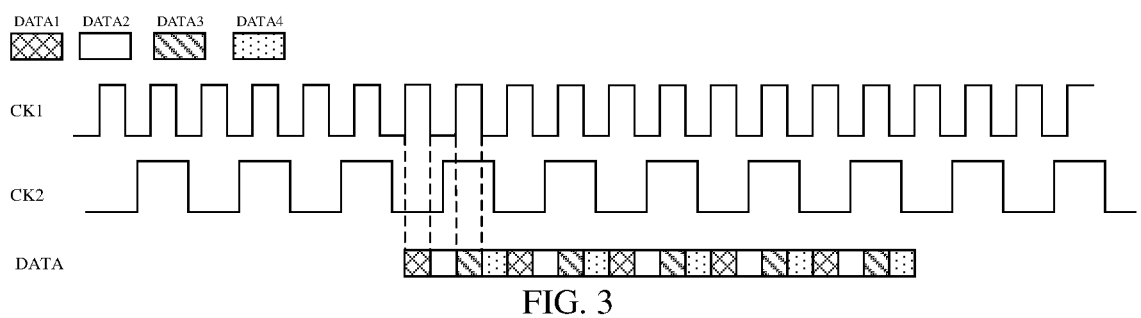
FIG. 3 is a timing diagram of a operation signal corresponding to each storage chip in a memory provided by an embodiment of the present disclosure.

It is to be noted that in other embodiments, the first command clock and the first data clock may also adopt different first clock signals. FIG. 3 is a timing diagram of an operation signal corresponding to each storage chip in the memory provided by the embodiment. CK1 is the first clock signal, CK2 is the second clock signal, DATA1 is a timing diagram of data transmission by the first storage chip 111, DATA2 is a timing diagram of data transmission by the second storage chip 112, DATA3 is a timing diagram of data transmission by the third storage chip 121, DATA4 is a timing diagram of data transmission by the fourth storage chip 122, and DATA is a timing diagram combining DATA1, DATA2, DATA3 and DATA4.

An operating principle of the memory provided by the embodiment will be illustrated below with reference to FIG. 3.

At the first rising edge for one first clock cycle of the first clock signal, the first storage chip 111 receives an activation command signal; at the first rising edge of another first clock cycle of the first clock signal, the first storage chip 111 receives a read command signal; and at the first rising edge of another first clock cycle of the first clock signal, the first storage chip 111 transmits data. At the first falling edge of the first clock signal, the second storage chip 112 receives an activation command signal; at the first falling edge of the first clock signal, the second storage chip 112 receives a read command signal; and at the first falling edge of the first clock signal, the second storage chip 112 transmits data. In this way, the first storage chip 111 transmits the data at the different first rising edges of the first clock signal, and the second storage chip 112 transmits the data at the different first falling edges of the first clock signal, until data transmission is completed.

At the second rising edge of the second clock signal, the third storage chip 121 receives an activation command signal; at the second rising edge of the second clock signal, the third storage chip 121 receives a read command signal; and at the second rising edge of the second clock signal, the third storage chip 121 transmits data. At the second falling edge of the second clock signal, the fourth storage chip 122 receives an activation command signal; at the second falling edge of the second clock signal, the fourth storage chip 122 receives a read command signal; and at the second falling edge of the second clock signal, the fourth storage chip 122 transmits data. In this way, the third storage chip 121 transmits the data at the different second rising edges of the second clock signal, and the fourth storage chip 122 transmits the data at the different second falling edges of the second clock signal, until data transmission is completed.

Since the first rising edge appears at the high level period of the second clock signal and the second rising edge appears at the low level period of the second clock signal, the first rising edge and the second rising edge can be identified with reference to the second clock signal. Therefore, it can be implemented that the first storage chip 111 operates at the first rising edge and the third storage chip 121 operates at the second rising edge. Similarly, the first falling edge and the second falling edge can also be identified with reference to the second clock signal. Therefore, it can be implemented that the second storage chip 112 operates at the first falling edge and the fourth storage chip 122 operates at the second falling edge.

It can be understood that the above illustration takes an example that the memory performs read operation. During a write operation period of the memory, the first storage chip 111 and the second storage chip 112 also transmit data alternately, and the third storage chip 121 and the fourth storage chip 122 also transmit data alternately.

In the embodiment, the first storage chip set 110 includes the two storage chips, and the second storage chip set 120 includes the two storage chips. That is, plurality of storage chips are configured to perform information interaction with the control chip 114 by adopting different clock edges of the first clock signal. The first clock signal has a first clock cycle. Different clock edges include two consecutive rising edges and two consecutive falling edges. That is, four storage chips share the channel 01.

It is to be noted that, in another example, plurality of storage chips can also be configured to perform information interaction with the control chip by adopting different clock edges of the first clock signal, and different clock edges include two consecutive rising edges and further include a single falling edge between the two rising edges. Correspondingly, taking as an example that a single falling edge is the first falling edge, the first storage chip set includes two storage chips, one storage chip performs information interaction with the control chip at the first rising edge and another storage chip performs information interaction with the control chip at the first falling edge. The second storage set may be a single storage chip, and this storage chip may perform information interaction with the control chip at the second rising edge. That is, three storage chips share the channel.

Further, in another example, plurality of storage chips can further be configured to perform information interaction with the control chip by adopting different clock edges of the first clock signal, and different clock edges include two consecutive falling edges and further include a single rising edge between two falling edges. Correspondingly, taking as an example that a single rising edge is the second rising edge, the first storage chip set may be a single storage chip, this storage chip performs information interaction with the control chip at the first falling edge. The second storage set includes two storage chips, one storage chip performs information interaction with the control chip at the first rising edge and another storage chip performs information interaction with the control chip at the second falling edge. That is, three storage chips share the channel According to the memory provided by the embodiment, the plurality of storage chips share the communication channel 01, and therefore, under the premise of not influencing a band width of the information interaction of the control chip 114 and the plurality of storage chips, the number of the communication channel 01 of the memory is decreased, and therefore the manufacturing cost and power consumption of the memory are reduced.

Another embodiment of the present disclosure further provides a memory. The memory is roughly the same as the above-mentioned embodiment, and the main difference includes more detailed illustration on each storage chip. The memory provided by the embodiment will be illustrated below in detail with reference to the drawings. It is to be noted that, the part the same as or corresponding to the above-mentioned embodiment may refer to the illustration of the above-mentioned embodiment, which will be not repeated hereinafter.

Figure 4:
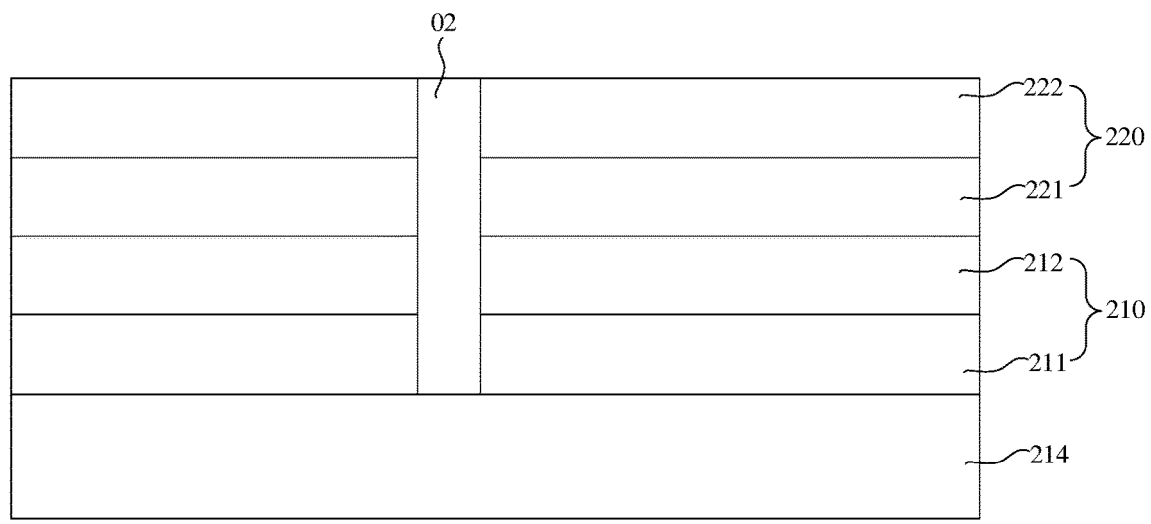
FIG. 4 is a schematic structural diagram of a memory provided by another embodiment of the present disclosure.
Figure 5:
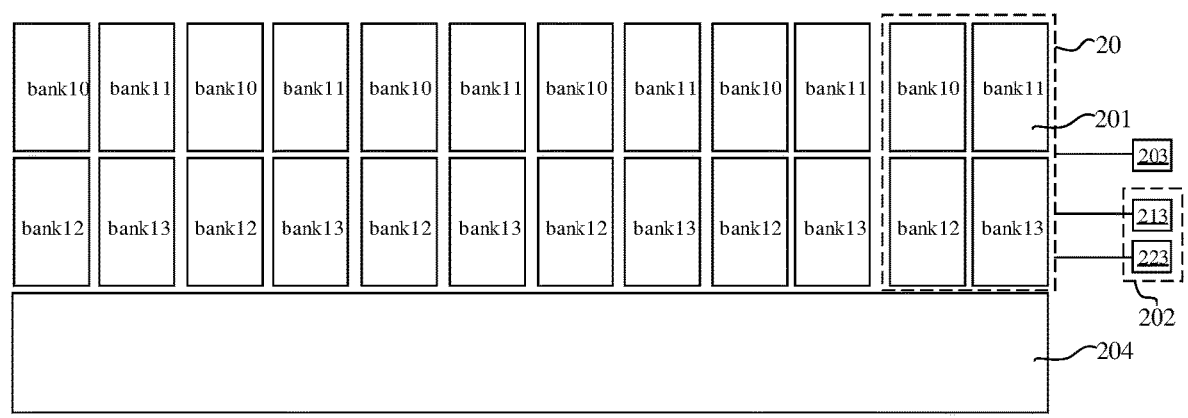
FIG. 5 is a schematic structural diagram of a storage chip in FIG. 4.

FIG. 4 is a schematic structural diagram of the memory provided by another embodiment of the present disclosure. FIG. 5 is a schematic structural diagram of one storage chip in FIG. 4.

Referring to FIG. 4 and FIG. 5, in the embodiment, the memory includes: a control chip 214; and a plurality of storage chips, in which the plurality of storage chips include a first storage chip set 210 and a second storage chip set 220, and the above-mentioned information interaction includes read/write operation. Each storage chip includes at least one channel 20. The channel 20 includes: a plurality of storage banks 201, in which each storage bank 201 includes a plurality of storage units, and the plurality of storage banks 201 are configured to perform the read/write operation alternately; a command port 202, in which the command port 202 is configured to receive a command signal at a corresponding clock edge, and the command signal is configured to control the read/write operation of the storage banks 201; and a data port 203, in which the data port 203 is configured to receive a data signal to be written into the storage banks 201 or send the data signal at the corresponding clock edge. The command port 202 includes a row address port 213 and a column address port 223, the row address port 213 is configured to receive a row address signal of a position where a target storage unit is located, the column address port 223 is configured to receive a column address signal of the position where the target storage unit is located, and the target storage unit is a storage unit selected from the plurality of storage units.

It can be understood that the corresponding clock edge refers to a first rising edge or falling edge of the first clock signal.

It is to be noted that the command port called in the embodiment includes a port for transmitting the command signal and the address signal, but is not limited to this.

The memory provided by the embodiment will be illustrated below in detail with reference to the drawings.

The plurality of storage units in each storage bank 201 may be distributed in an array. In the embodiment, taking an example that each channel 20 includes four storage banks 201, the four storage banks 201 in one channel 20 are illustrated as bank10, bank11, bank12 and bank13 in FIG. 5. It may be understood that in other embodiments, the number of the storage banks included in each channel may also be any other number, such as two or six.

The data port 203 is configured to receive data to be stored into the storage units or send the data read from the storage units.

The storage chips include the plurality of channels 20, and the storage chips further include a common circuit 204 shared by the plurality of channels 20. In the embodiment, the common circuit 204 may be a test control circuit, and the test control circuit is configured to control testing of the plurality of channels 20. In other embodiments, the common circuit may also be at least one of a temperature sensor circuit, an analogy circuit or a charge pump circuit.

The memory may further include: a test port. Under a test mode, the plurality of channels 20 share the same test port for testing. Since the common test port is disposed, the number of ports in the memory is decreased advantageously, thereby reducing the difficulty of testing the memory through a probe card, and reducing the manufacturing difficulty of the probe card.

As for the storage chips in the first storage chip set 210, the corresponding clock edge includes the first rising edge and/or the first falling edge; and as for the storage chips in the second storage chip set 220, the corresponding clock edge includes the second rising edge and/or the second falling edge.

The command signal includes activation commands and read commands corresponding to respective activation commands. The channel 20 is further configured such that the command port 202 receives the read command corresponding to the activation command after the command port 202 receives the activation command for a storage bank. More specifically, the activation command includes the row address signal, and the row address signal is received through the row address port 213; and the read command includes the column address signal, and the column address signal is received through the column address port 223. It is to be noted that the activation command and the read command may further contain other control signals except the row address signal or the column address signal. These other control signals are configured to help or assist the storage chips to recognize whether the command is the activation command or the read command, and these other control signals may be received through other command ports except the row address port 213 and the column address port 223. In this way, the row address port 213 may continuously receive the row address signal, and the column address port 223 may continuously receive the column address signal. Accordingly, the channel 20 is further configured such that the activation command and the read command are received through different ports in the command port 202, and thus the activation command and the read command may be received simultaneously. Furthermore, the channel 20 is further configured such that the data port 203 sends the data signal after the command port 202 receives the read command.

In the embodiment, the command signal includes the activation command and the read command corresponding to the activation command. The channel is further configured such that after the command port 202 alternately receives the activation commands for the different storage banks 201, the command port 202 alternately receives the read commands corresponding to the activation commands Specifically, after the row address port 213 alternately receives the activation commands for the different storage banks 201, the column address port 223 alternately receives the read commands corresponding to the activation commands.

Furthermore, the channel is further configured such that the data port 203 alternately sends the data signals corresponding to the different storage banks 201 after the command port 202 receives the read command.

The first storage chip set 210 includes a first storage chip 211 and a second storage chip 212; and the second storage chip set 220 includes a third storage chip 221 and a fourth storage chip 222.

For detailed description related to difference between the first storage chip set 210 and the second storage chip set 220, reference may be made to the above-mentioned embodiments. Taking the storage chips in the first storage chip set 210 as an example, and the first storage chip 211 operates at the first rising edge, the second storage chip 212 operates at the first falling edge, the third storage chip 221 operates at the second rising edge, and the fourth storage chip 222 operates at the second falling edge, an operation mode of the command port 202 is illustrated below in detail.

The command port 202 of the first storage chip 211 adopts the first rising edge of the first clock signal to receive or send a signal, the data port 203 adopts the first rising edge of the first clock signal to receive or send the signal, and the storage chip is denoted as the storage chip C1. The command port 202 of the second storage chip 212 adopts the first falling edge of the first clock signal to receive or send a signal, the data port 203 adopts the first falling edge of the first clock signal to receive or send the signal, and the storage chip is denoted as the storage chip C2. The command port 202 of the third storage chip 221 adopts the second rising edge of the first clock signal to receive or send a signal, the data port 203 adopts the second rising edge of the first clock signal to receive or send the signal, and the storage chip is denoted as the storage chip C3. The command port 202 of the fourth storage chip 222 adopts the second falling edge of the first clock signal to receive or send a signal, the data port 203 adopts the second falling edge of the first clock signal to receive or send the signal, and the storage chip is denoted as the storage chip C4.

Figure 6:
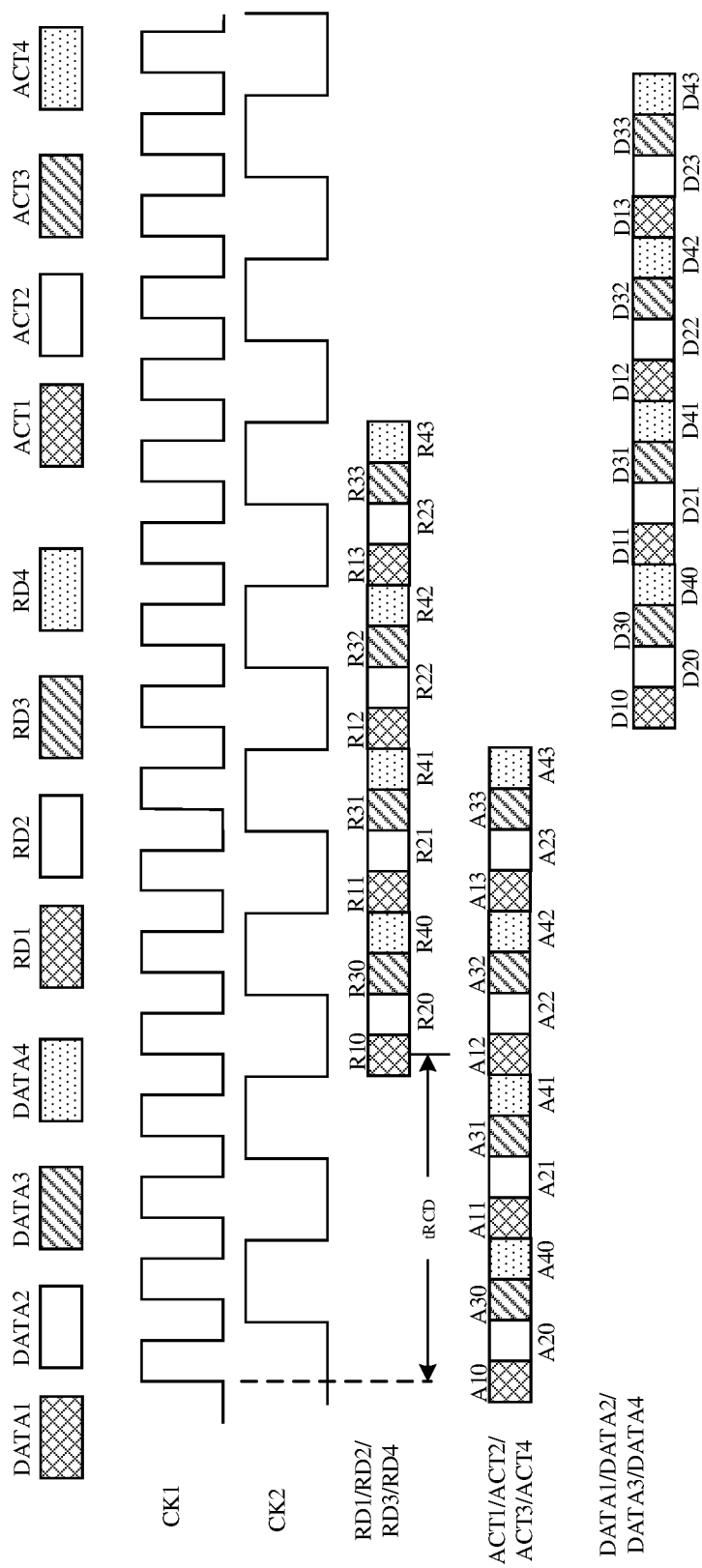
FIG. 6 is a timing diagram of operations of all storage chips in a memory provided by another embodiment of the present disclosure.

FIG. 6 is a timing diagram of the operations of the storage chips C1/C2/C3/C4. The operating principle of the memory will be illustrated below with reference to the timing diagram.

In FIG. 6, CK1 shows the first clock signal, CK2 shows the second clock signal, ACT1/ACT2/ACT3/ACT4 correspondingly show the timing diagram of the activation command signals for the storage chips C1/C2/C3/C4, RD1/RD2/RD3/RD4 show the timing diagram of the read command signals for the storage chips C1/C2/C3/C4, and DATA1/DATA2/DATA3/DATA4 show the timing diagram of the data signals of the data ports of the storage chips C1/C2/C3/C4.

Taking an example that the storage chip C1 includes the four storage banks 201 of bank10, bank11, bank12 and bank13, the activation command signal ACT1 includes A10/A11/A12/A13 configured to activate bank10, bank11, bank12 and bank13 respectively, A10 corresponds to bank10, A11 corresponds to bank11, and so on. The read command signal RD1 includes R10/R11/R12/R13 corresponding to bank10, bank11, bank12 and bank13 one to one, and the data signal DATA1 includes D10/D11/D12/D13. The activation command A10 corresponds to bank10, one read command R10 and the data signal D10; the activation command A11 corresponds to bank11, one read command R11 and the data signal D11; the activation command A12 corresponds to bank12, one read command R12 and the data signal D12; and the activation command A13 corresponds to bank13, one read command R13 and the data signal D13. That is, one activation command corresponds to one read command.

The detailed illustration related to the activation command signals A20/A21/A22/A23, the read command signals R20/R21/R22/R23 and the data signals D20/D21/D22/D23 corresponding to the storage chip C2, the activation command signals A30/A31/A32/A33, the read command signals R30/R31/R32/R33 and the data signals D30/D31/D32/D33 corresponding to the storage chip C3, and the activation command signals A40/A41/A42/A43, the read command signals R40/R41/R42/R43 and the data signals D40/D41/D42/D43 corresponding to the storage chip C4 may refer to the above-mentioned illustration.

As illustrated in FIG. 6, as for the storage chip C1, taking an example that the command port 202 and the data port 203 adopt the first rising edge of the first clock to receive or send a signal: after the command port 202 receives the activation command A10 for one storage bank 201 (refer to FIG. 5) at the first rising edge of the first clock signal, the command port 202 receives one read command R10 corresponding to the activation command A10 at the rising edge; and after the command port 202 receives the read command R10, the data port 203 sends the data signal D10 at the first rising edge of the first clock signal. The flow after the command port 202 receives the activation commands A11/A12/A13 is similar to that of the above mentioned.

Specifically, the row address port 213 in the command port 202 receives the activation command A10 for activating bank10 at the first rising edge of the first clock signal, and the row address port 213 in the command port 202 receives the activation command A11 for activating bank11 at the first rising edge of the first clock signal, receives the activation command A12 for activating bank12 at the first rising edge of the first clock signal, and receives the activation command A12 for activating bank13 at the first rising edge of the first clock signal. The column address port 223 in the command port 202 receives the read command R10 corresponding to the activation command A10 at the first rising edge, and the command port 202 receives the read command R11 corresponding to the activation command A11 at the first rising edge, receives the read command R12 corresponding to the activation command A12 at the first rising edge, and receives the read command R13 corresponding to the activation command A13 at the first rising edge, in which n is any natural number. Accordingly, the data port 203 sends the data signal D10 corresponding to the storage bank bank10 at the first rising edge of the first clock signal, and the data port 203 sends the data signal D11 corresponding to the storage bank bank11 at the first rising edge of the first clock signal, sends the data signal D12 corresponding to bank12 at the first rising edge, and sends the data signal D13 corresponding to bank13 at the first rising edge, in which m is any natural number.

It is to be noted that FIG. 6 takes an example that the activation commands A10, A11, A12 and A13 are received respectively at the continuous first rising edge, that is, the activation commands corresponding to the different storage banks 201 are received respectively at the continuous first rising edge. In other embodiments, the activation commands corresponding to the different storage banks may also be received respectively at non-continuous first rising edges.

It can be seen from FIG. 6 that the row address port 213 and the column address port 223 are not shared, and therefore, during the period that the column address port 223 receives the read command R10, the row address port 213 may receive the activation command A12. In this way, the activation commands can be received without the need of waiting all the read command signals to be completely received, thus a data bus may be filled, that is, the data port 203 may transmit the data continuously, thereby avoiding the idle problem of the data bus in a certain period of time, and increasing the storage speed of the memory advantageously.

Furthermore, as illustrated in FIG. 6, as for the storage chip C2, the command port 202 and the data port 203 adopt the falling edge of the first clock signal to receive or send a signal: after the command port 202 receives the activation command A0 for one storage bank 201 at the first falling edge of the first clock signal, the command port 202 receives one read command R20 corresponding to the activation command A20 at the first falling edge; and after the command port 202 receives the read command R20, the data port 203 sends the data signal D20 at the first falling edge of the first clock signal. A process related to the storage chip C2 sending the data signals D21/D22/D23 will not be repeated in detail.

Operating processes related to the storage chip C3 and the storage chip C4 are similar to the operation mode of the above-mentioned storage chips C1/C2, and may refer to the above-mentioned illustration, which will not be repeated. The storage chips C1/C2/C3/C4 receive or send the signals at the first rising edge, the first falling edge, the second rising edge and the second falling edge of the first clock cycle of the first clock signal, so that the four storage chips sharing the communication channel 02 transmit the data without interfering each other.

In another example, the command signal includes activation commands and a plurality of read commands corresponding to each activation command. The channel 20 is further configured such that after the command port 202 receives the activation command for a storage bank 201, the command port 202 receives one read command corresponding to the activation command at the plurality of corresponding clock edges, that is, the command port 202 receives the plurality of read commands corresponding to the activation commands at the plurality of consecutive corresponding clock edges. The channel 20 is further configured such that the data port 203 sends the plurality of data signals at the plurality of consecutive corresponding clock edges, and the number of the data signals is the same as the number of the received read commands Specifically, the activation command includes the row address signal, and the read command includes the column address signal. The channel 20 is further configured such that the activation command and the read command are received through the different ports in the command port.

Furthermore, the command signal may include the activation commands and a plurality of read commands corresponding to each activation command. The channel 20 may further be configured such that the command port 202 alternately receives the plurality of read commands corresponding to each activation command after the command port 202 alternately receives the activation commands for the different storage banks 201. Specifically, after the command port 202 alternately receives the activation commands for the different storage banks 201, the command port 202 receives one read command corresponding to the activation command at each clock edge in the plurality of corresponding clock edges, so that the command port 202 receives the plurality of read commands corresponding to the activation commands at the plurality of continuous clock edges, until the command port 202 receives the plurality of read commands corresponding to the activation command, and then the command port 202 receives the plurality of read commands corresponding to the activation command for another storage bank 201.

Figure 7:
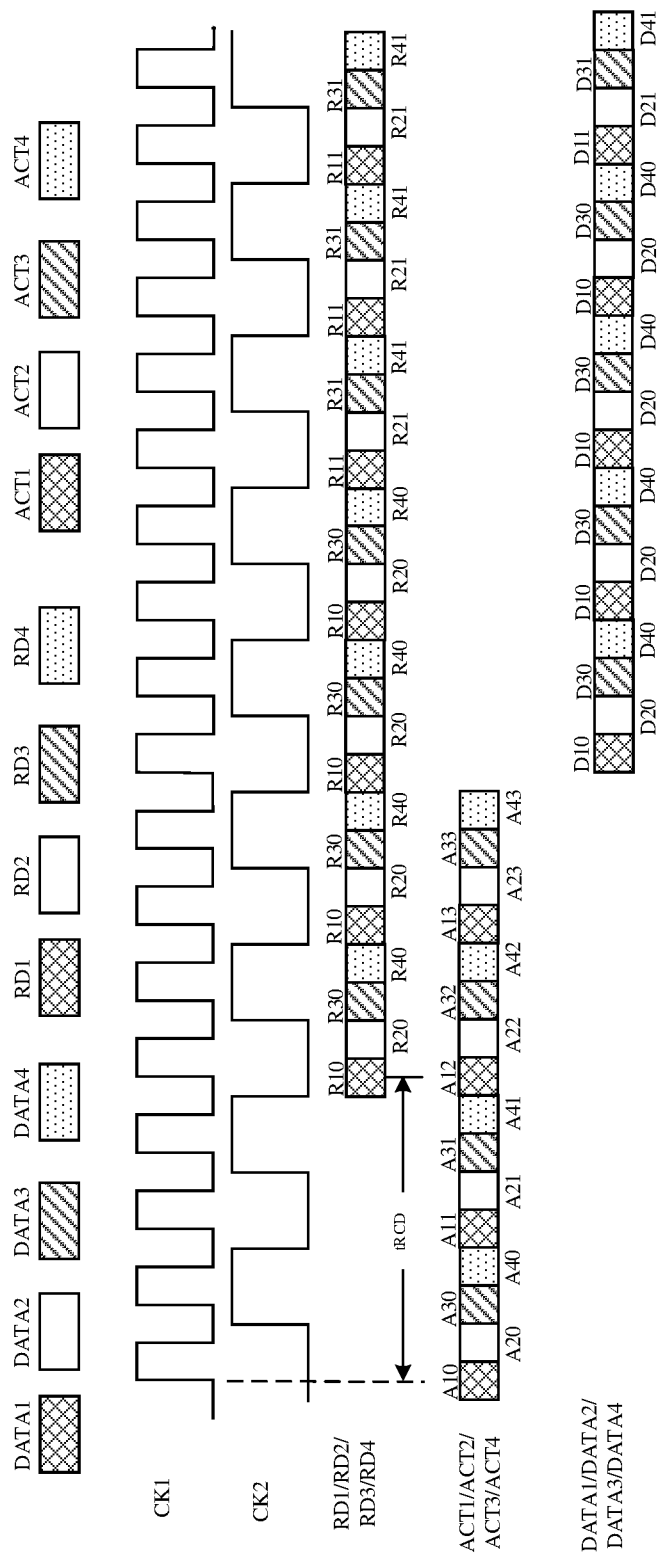
FIG. 7 is another timing diagram of operations of all storage chips in a memory provided by another embodiment of the present disclosure.

FIG. 7 is another timing diagram of operations of the first storage chip set 210 and the second storage chip set 220. The operating principle of the memory will be illustrated below with reference to FIG. 7, taking an example that one activation command corresponds to four read commands.

Illustration related to all the signals in FIG. 7 may refer to corresponding illustration in FIG. 6, and main difference corresponding to FIG. 6 includes: the activation command A10 configured to activate bank10 corresponds to the four read commands R10 and the four data signals D10, the activation command A11 configured to activate bank11 corresponds to the four read commands R11 and the data signals D11, and so on. That is, one activation command corresponds to the plurality of different read commands.

Taking the storage chip C1 receiving or sending the signal at the first rising edge of the first clock signal as an example: as illustrated in FIG. 7, after the command port 202 receives the activation command A10 for one storage bank 201 at the first rising edge of the first clock signal, the command port 202 receives the four read commands R10 corresponding to the activation command A10 at the four continuous first rising edges, and after the command port 202 receives the read commands R10, the data port 203 sends the four data signals D10 at the first rising edge of the first clock signal. After receiving the activation command A11 for another storage bank 201, the command port 202 receives the four read commands R11 corresponding to the activation command A11 at the four continuous first rising edges, and after the command port 202 receives the read commands R11, the data port 203 sends the four data signals D11 at the first rising edge of the first clock signal. The flow after the command port 202 receives the activation commands A12 and A13 is similar to that of the above mentioned.

The storage chip C2 sends or receives the signal at the first falling edge of the first clock signal, that is, the storage chip C2 performs information interaction with the control chip 214 at the first falling edge of the first clock signal. The storage chip C3 performs information interaction with the control chip 214 at the second rising edge of the first clock signal, and the storage chip C4 performs information interaction with the control chip 214 at the second falling edge of the first clock signal. The operating principle of the storage chips C2/C3/C4 may refer to the operating principle of the storage chip C1.

It is to be noted that in the embodiment, the channel 20 is further configured: as for any storage bank 201, a time reference between receiving the activation command and receiving the corresponding read command is larger than or equal to tRCD, and tRCD is the shortest preparation time for performing the read operation by the storage bank 201 after receiving the activation command Specifically, the definition about tRCD is: an interval from line validness to sending of the read/write command is defined as tRCD, namely, delay from RAS to CAS, RAS is a row address strobing pulse signal, or the row address signal for short, CAS is a column address strobing pulse signal, or the column address signal for short, and tRCD may be understood as a row strobing period. In this way, it may be ensured that the storage banks 201 have been completely activated before receiving the read command or at the time of receiving the read command, and the read operation may be performed at the time of receiving the read command, thereby further increasing the storage speed of the memory.

Specifically, taking the storage chip C1 as an example, as illustrated in FIG. 6 and FIG. 7, as for bank10, the time difference between A10 and R10 is tRCD; and as for bank11, the time difference between A11 and R11 may be larger than or equal to tRCD. The situations with respect to bank12 and bank13 are not listed one by one here. Whether one activation command corresponds to one read command or the plurality of read commands, it may be ensured through reasonable setting that the time reference between receiving the command signal and receiving the corresponding read command signal is larger than or equal to tRCD as for any storage bank 201.

In the memory provided by the embodiment, the different storage banks 201 adopt the same command port 202 and the same data port 203. In other embodiments, the different storage banks may also adopt different command ports and different data ports.

The memory provided by the embodiment may realize simultaneous transmission of the row address signal and the column address signal due to the fact that the row address port 213 and the column address port 223 are separated, a data receiving or sending error caused by an error generated by handshake or synchronization of the command clock and the data clock is avoided, thus the problem that the data cable is not occupied completely at the certain time periods is avoided advantageously, and it is ensured that the data cable is occupied completely by the data all the time, thereby increasing the storage speed of the memory, and improving the storage performance of the memory.

The technical solution provided by the embodiment of the present disclosure has at least the following advantages:

The embodiment of the present disclosure provides the memory with excellent structural performance. The plurality of storage chips share the communication channel to be electrically connected with the control chip. The plurality of storage chips are configured to perform information interaction with the control chip by adopting different clock edges of a first clock signal, the first clock signal has a first clock cycle, the different clock edges include two consecutive rising edges and/or two consecutive falling edges, the plurality of storage chips are further configured to receive a second clock signal and distinguish the different clock edges based on the second clock signal, and a second clock cycle of the second clock signal is greater than the first clock cycle. The plurality of storage chips share the communication channel to be electrically connected with the control chip, therefore, there is no need to dispose a communication channel electrically connected with the control chip for each storage chip, thereby decreasing the number of the communication channels required by the memory advantageously, and reducing the cost and the power consumption of the memory accordingly.

In some embodiments, the row address port and the column address port are separated, therefore the row address signal and the column address signal may be transmitted simultaneously, avoiding the problem that an activation command signal can only be transmitted after the read command is transmitted. Thus, the problem that a data cable is not occupied completely at certain time periods is avoided advantageously, and it is ensured that the data cable is occupied completely by data all the time, thereby increasing the storage speed of the memory, and improving the storage performance of the memory.

Those ordinarily skilled in the art can understand that all the above implementations are the specific embodiments for realizing the present disclosure. However, in actual application, various modifications may be made to the implementations in form and in detail without departing from the spirit and scope of the embodiments of the present disclosure. Any skilled in the art can make respective changes and modifications without departing from the spirit and scope of the embodiments of the present disclosure, and therefore, the protection scope of the embodiments of the present disclosure should be limited by the claims.

The invention claimed is:

1. A memory, comprising:
a control chip; and
a plurality of storage chips, wherein the plurality of storage chips are electrically connected with the control chip via a common communication channel, the plurality of storage chips are configured to perform information interaction with the control chip by adopting different clock edges of a first clock signal, the first clock signal has a first clock cycle, the different clock edges comprise at least one of two consecutive rising edges or two consecutive falling edges, the plurality of storage chips are further configured to receive a second clock signal and distinguish the different clock edges based on the second clock signal, and a second clock cycle of the second clock signal is greater than the first clock cycle,
wherein the different clock edges comprise a first rising edge, a first falling edge, a second rising edge and a second falling edge that are consecutive; and the plurality of storage chips comprise a first storage chip set and a second storage chip set;
wherein the first storage chip set comprises a first storage chip and a second storage chip, the first storage chip performs information interaction with the control chip at the first rising edge, and the second storage chip performs information interaction with the control chip at the first falling edge; and the second storage chip set comprises a third storage chip and a fourth storage chip, the third storage chip performs information interaction with the control chip at the second rising edge, and the fourth storage chip performs information interaction with the control chip at the second falling edge.

2. The memory of claim 1, wherein the first clock cycle is equal to a half of the second clock cycle.

3. The memory of claim 1, wherein each storage chip comprises at least one channel; the channel comprises: a plurality of storage banks, wherein each storage bank comprises a plurality of storage units, and the plurality of storage banks are configured to perform read/write operation alternately; a command port, wherein the command port is configured to receive a command signal at a corresponding clock edge, and the command signal is configured to control the read/write operation of the storage banks; and a data port, wherein the data port is configured to receive a data signal to be written into the storage banks or send a data signal at the corresponding clock edge; and the command port comprises a row address port and a column address port, the row address port is configured to receive a row address signal of a position where a target storage unit is located, the column address port is configured to receive a column address signal of the position where the target storage unit is located, and the target storage unit is a storage unit selected from the plurality of storage units.

4. The memory of claim 3, wherein the command signal comprises activation commands and read commands corresponding to respective activation commands; and the channel is further configured such that the command port receives the read command corresponding to the activation command after the command port receives the activation command for a storage bank.

5. The memory of claim 4, wherein the channel is further configured such that the data port sends the data signal after the command port receives the read command.

6. The memory of claim 3, wherein the command signal comprises activation commands and a plurality of read commands corresponding to each activation command; and the channel is further configured such that after the command port receives the activation command for a storage bank, the command port receives one read command corresponding to the activation command at each of the plurality of corresponding clock edges, to receive the plurality of read commands corresponding to the activation command at the plurality of consecutive corresponding clock edges.

7. The memory of claim 6, wherein the channel is further configured such that the data port sends the plurality of data signals at the plurality of consecutive corresponding clock edges respectively, and a number of the data signals is the same as a number of the received read commands.

8. The memory of claim 3, wherein the command signal comprises an activation command and a read command corresponding to the activation command; and the channel is further configured such that after the command port alternately receives the activation commands for the different storage banks, the command port alternately receives the read commands corresponding to the activation commands.

9. The memory of claim 8, wherein the channel is further configured such that the data port alternately sends the data signals corresponding to the different storage banks after the command port receives the read command.

10. The memory of claim 3, wherein the command signal comprises activation commands and a plurality of read commands corresponding to each activation command; and the channel is further configured such that the command port alternately receives the activation commands for the different storage banks, and the command port alternately receives the plurality of read commands corresponding to each activation command.

11. The memory of claim 4, wherein the activation command comprises the row address signal, and the read command comprises the column address signal; and the channel is further configured such that the activation command and the read command are received through different ports in the command port.

12. The memory of claim 11, wherein the channel is further configured such that, for any of the storage banks, a time difference between receiving the activation command and receiving the read command corresponding to the activation command is greater than or equal to tRCD, and the tRCD is a shortest preparation time that a reading operation is able to be performed after the activation command is received by a respective storage bank.

13. The memory of claim 3, wherein the storage chips comprise the plurality of channels, and the storage chips further comprise a common circuit shared by the plurality of channels.

14. The memory of claim 13, wherein the storage chips further comprise: a test port, and in a test mode, the plurality of channels share a same test port for testing.

15. The memory of claim 13, wherein the common circuit comprises a test control circuit, and the test control circuit is configured to control testing of the plurality of channels.

16. The memory of claim 1, wherein the plurality of storage chips are sequentially stacked on the control chip, and the common communication channel comprises a through silicon via.

* * * * *